United States Patent
Wu (10) Patent No.: US 6,737,900 B1
(45) Date of Patent: May 18, 2004

(54) SILICON-ON-INSULATOR DYNAMIC D-TYPE FLIP-FLOP (DFF) CIRCUITS

(75) Inventor: Gary Chunshien Wu, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 10/120,921

(22) Filed: Apr. 11, 2002

(51) Int. Cl.[7] .......................... H03K 3/037; H03K 3/12; H03K 3/356
(52) U.S. Cl. ...................................... 327/218; 210/211
(58) Field of Search .................. 327/208, 209, 327/210, 211, 212, 218, 199, 200, 201; 326/93–98

(56) References Cited

U.S. PATENT DOCUMENTS

| | | | | |
|---|---|---|---|---|
| 4,057,741 A | * | 11/1977 | Piguet | 327/211 |
| 5,592,114 A | | 1/1997 | Wu et al. | 327/208 |
| 5,930,322 A | * | 7/1999 | Yang et al. | 377/48 |
| 6,060,927 A | * | 5/2000 | Lee | 327/218 |
| 6,087,865 A | * | 7/2000 | Bradley | 327/117 |
| 6,094,466 A | | 7/2000 | Yang et al. | 377/47 |
| 6,417,703 B1 | * | 7/2002 | Bradley | 327/105 |
| 6,462,595 B1 | * | 10/2002 | Hsu et al. | 327/215 |

OTHER PUBLICATIONS

Yuan, et al., "High Speed CMOS Circuit Technique", IEEE Journal of Solid–State Circuits, vol. 24, No. 1, Feb. 1989, pp. 62–70.
Yang, et al., "New Dynamic Flip–Flops for High–Speed Dual–Modulus Prescaler", IEEE Journal of Solid–State Circuits, vol. 33, No. 10, Oct. 1998, pp. 1568–1571.
Chang, et al. "A 1.2 GHz CMOS Dual–Modulus Prescaler Using New Dynamic D–Type Flip–Flops", IEEE Journal on Solid–State Circuits, vol. 31, No. 5, May, 1996, pp. 749–752.
"Ratioed Logic", www.umbc.edu/~plusquel/vlsill/slides/comb_logic2.html, pp. 1–11.
Soares, Jr., et al., "A 1.6–GHz Dual Modulus Prescaler Using the Extended True–Single–Phase–Clock CMOS Circuit Technique (E–TSPC)", IEEE Journal of Solid–State Circuits, vol. 34, No. 1, Jan. 1999, pp. 97–102.

* cited by examiner

Primary Examiner—Tuan T. Lam
(74) Attorney, Agent, or Firm—Martin J. Jaquez, Esq.; William C. Boling, Esq.; Jaquez & Associates (57) ABSTRACT

A novel dynamic DFF method and apparatus using CMOS is disclosed. The present invention does not use ratioed logic transistors in implementing a first stage of the DFF design. Thus, PMOS and NMOS transistors, used in the first stage of the DFF circuit, do not have severely disproportionate P-to-N transistor size ratios. These transistors therefore can have a transistor size ratio that increases the circuit's operating speeds.

32 Claims, 9 Drawing Sheets

(Prior Art)

SILICON-ON-INSULATOR DYNAMIC D-TYPE FLIP-FLOP (DFF) CIRCUITS

BACKGROUND OF THE INVENTION

1. Field of the Invention

This invention relates to electrical divide-by circuits for dividing down signals, and more particularly to dynamic d-type flip-flop circuits used in digital devices such as microprocessors, digital signal processors, prescalers and digital counters.

2. Description of Related Art

Digital devices frequently utilize circuits that are capable of storing data (i.e., "memory" circuits). One exemplary basic memory circuit is the well-known d-type flip-flop (DFF). Exemplary digital devices that utilize DFFs include microprocessors, digital signal processors, prescalers, and digital counters.

One objective of DFF design is to increase the maximum operating frequency of the DFF circuits. The "maximum operating frequency" (MOF) is defined as the highest clock frequency at which a DFF maintains stable operation (ie., maintains accurate data storage). Several exemplary "dynamic" DFF circuits are now described. The term dynamic refers to the well-known, low-power, high-speed technique of temporarily storing digital information (e.g., a data bit) in the nodal capacitance at the gate of a MOS transistor. This capacitance can include both the parasitic and gate capacitance.

A first exemplary DFF circuit is referred to as a true single phase clock d-type flip-flip (TSPC DFF) circuit and is described in more detail in an article by Yuan and Svensson, entitled "High-Speed CMOS Circuit Technique" published in the IEEE Journal of Solid State Circuits, 24(1), pages 62–70 in 1989 by IEEE, which is hereby incorporated by reference herein for its teachings on digital circuits design. The TSPC DFF is widely implemented as a high-speed DFF in speed-critical applications.

Figure 1:
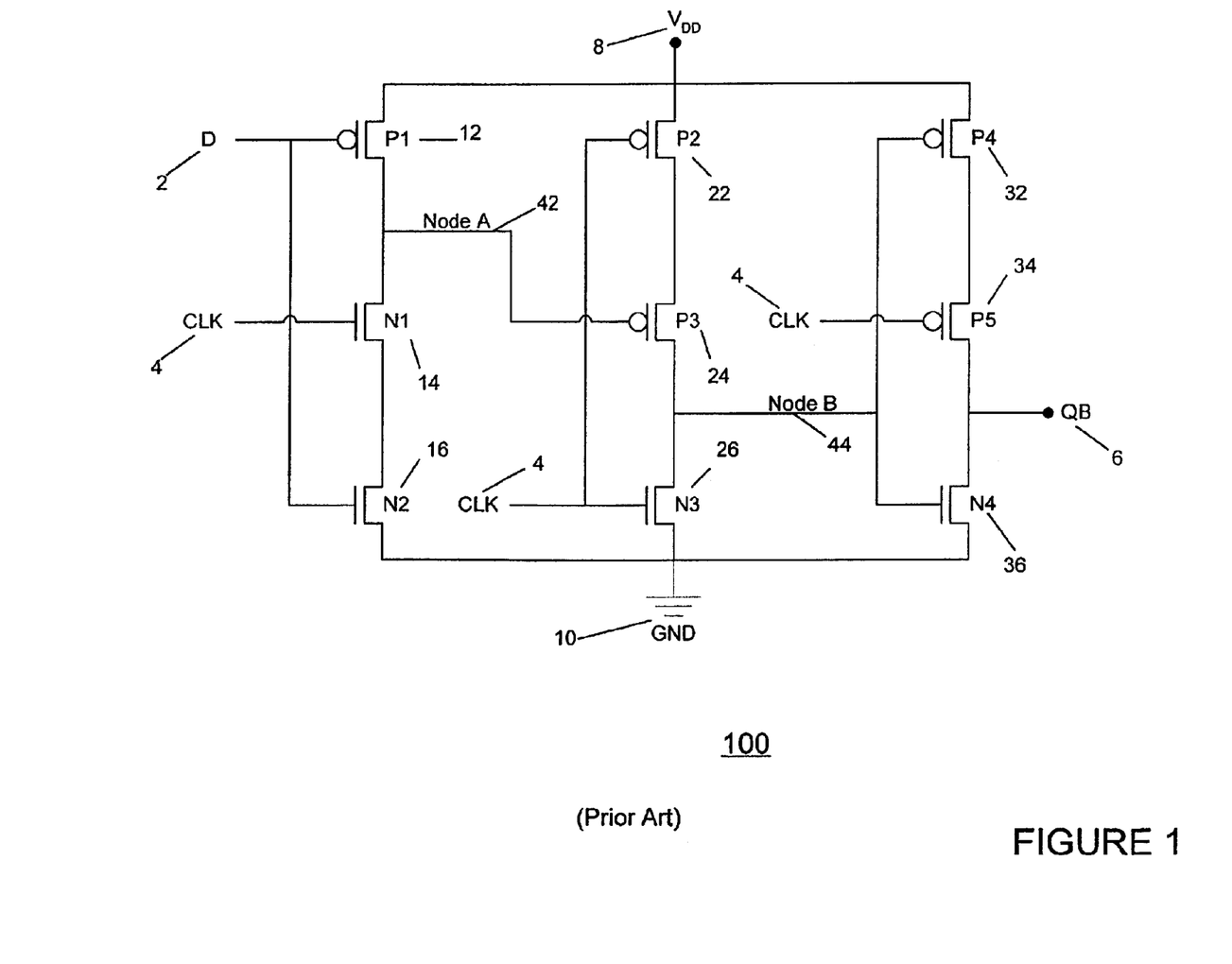
FIG. 1 is a schematic diagram of an exemplary prior art TSPC DFF circuit.

FIG. 1 is a schematic diagram of an exemplary TSPC DFF circuit. As shown in FIG. 1, the exemplary TSPC DFF circuit 100 includes nine transistors: N1 14, N2 16, N3 26, N4 36, P1 12, P2 22, P3 24, P4 32 and P5 34. For simplification, the description of the inventive uses the following nomenclature: transistors with an "N" prefix (e.g., N3 26) comprise NMOS transistors. Transistors with a "P" prefix (e.g., P5 34) comprise PMOS transistors. Those skilled in the electrical circuit design arts shall recognize that alternative terms can be used without departing from the scope or spirit of the present invention. A clock signal inputs to 4 transistors: N1 14, P2 22, N3 26 and P5 34.

The exemplary TSPC DFF circuit 100 typically comprises three stages. Each stage typically comprises a set of "stacked" transistors, wherein elements are vertically "stacked". For example, a first stage comprises transistors P1 12, N1 14 and N2 16; a second stage comprises transistors P2 22, P3 24 and N3 26; and a third stage comprises transistors P4 32, P5 34 and N4 36. In the exemplary TSPC DFF circuit 100 the relative sizes of transistors within each stage are not critical to the proper operation of the circuit. The exemplary TSPC DFF circuit 100 is described in greater detail in the above-incorporated article by Yuan and Svensson, and thus is not described in more detail herein. A stand exemplary DFF circuit is now described with reference to FIG. 2.

A second exemplary DFF circuit improves upon the first exemplary DFF circuit by implementing well-known "ratioed logic" techniques. To function properly, ratioed logic techniques require that the PMOS and NMOS transistors within a stage have a specific transistor size (ie., dimension or width/length (W/L)) ratio. Ratioed logic techniques are well known, and thus are not described in more detail herein. Exemplary ratioed logic techniques are described in a book by Van Valkenburg, entitled "Reference Data for Engineers, eighth edition" published in 1995 by Sams publishing, chapter 20, pages 20–35 and 20–36, which is hereby incorporated by reference herein for its teachings on ratioed logic circuit design techniques. Using ratioed logic techniques advantageously reduces the number of transistors needed in circuit implementations, and thus, increases circuit speed.

Figure 2:
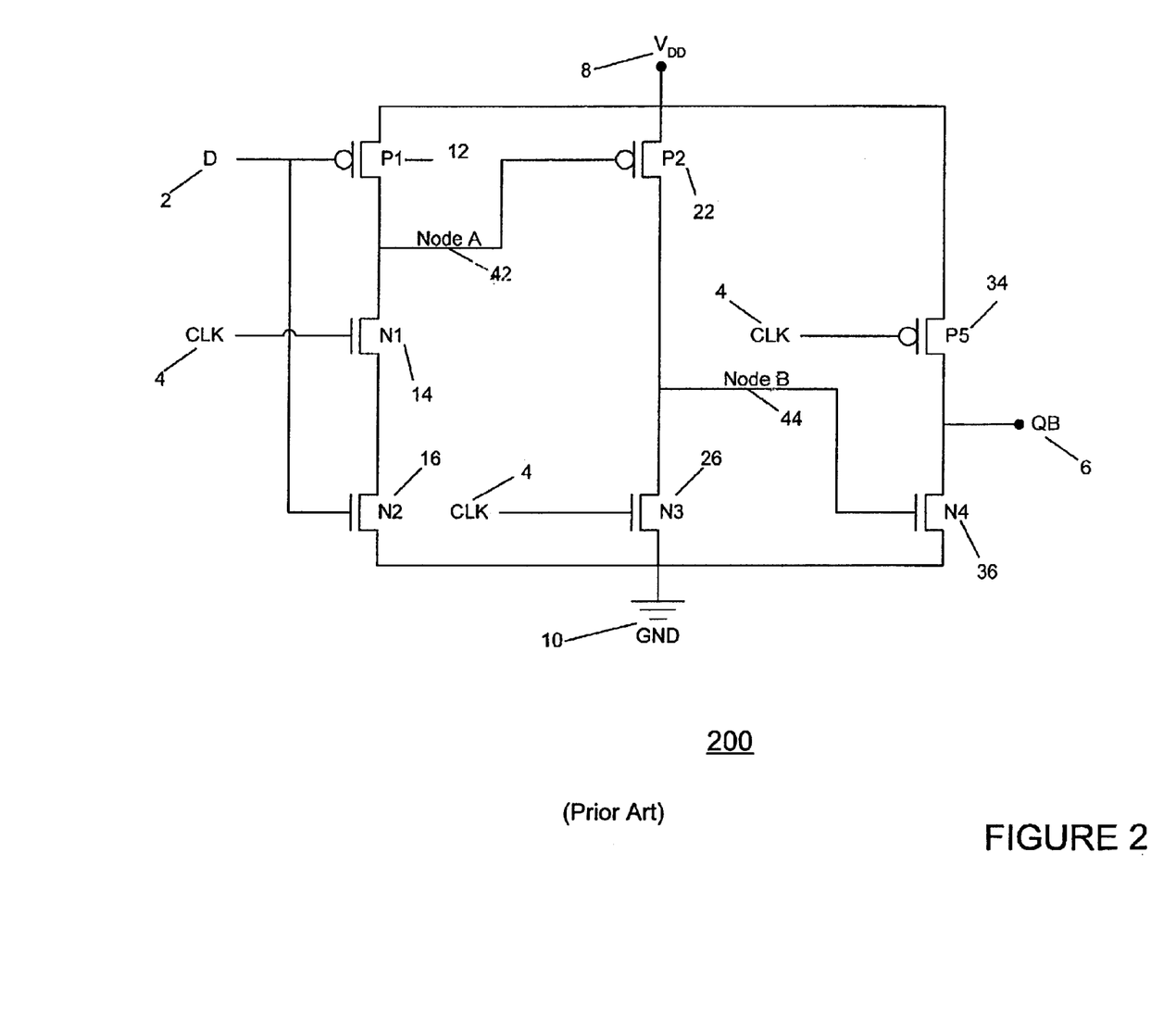
FIG. 2 is a schematic diagram of an exemplary prior art ND DFF.

The second exemplary DFF circuit comprises only 7 transistors, whereas the first exemplary TSPC DFF circuit 100 comprises 9 transistors. The second exemplary circuit is referred to as a "New Dynamic D-Type Flip-Flop" (ND DFF) and is described in detail in an article by Chang et al., entitled "A 1.2 GHz CMOS Dual-Modulus Prescaler Using New Dynamic D-Type Flip-Flops," published in the IEEE Journal of Solid State Circuits, 31(5), at pages 749–752 in 1996 by IEEE. The article is hereby incorporated by reference herein for its teachings on digital circuit design. FIG. 2 is a schematic diagram of an exemplary ND DFF. As shown in FIG. 2, the exemplary ND DFF circuit 200 comprises 7 transistors: N1 14, N2 16, N3 26, N4 36, P1 12, P2 22 and P5 34. A clock signal is input into 3 transistors: N1 14, N3 26 and P5 34. The exemplary ND DFF 200 advantageously exhibits less clock loading than does the TSPC DFF described above with reference to FIG. 1. Specifically, the clock driver of the TSPC DFF 100 of FIG. 1 drives four transistors (specifically, the transistors N1 14, P2 22, N3 26 and P5 34), whereas the clock driver of the exemplary ND DFF 200 of FIG. 2 drives only three transistors (N1 14, N3 26 and P5 34).

The ND DFF circuit 200 typically includes three transistor stages. A first stage comprises the transistors P1 12, N1 14 and N2 16; a second stage comprises the transistors P2 22 and N3 26; and a third stage comprises the transistors P5 34 and N4 36. The second stage of the exemplary ND DFF circuit 200 uses a ratioed logic technique. The ratioed logic technique requires a transistor size ratio between P2 and N3 to be selected so that when P2 and N3 are both "on", (i.e., conducting) node B is below the $V_{IL}$ of N4. Similarly, the third stage also implements ratioed logic where the QB6 is below the $V_{IL}$ of an output buffer (not shown in FIG. 2) connected to the QB6. The exemplary ND DFF 200 is described in greater detail in the above-incorporated article by Chang et al., and thus is not described in more detail herein. A third exemplary DFF circuit is now described with reference to FIG. 3.

A third exemplary DFF circuit improves upon the second exemplary DFF circuit by using fewer transistors, and thereby improves circuit performance. The third exemplary DFF circuit includes only 6 transistors, whereas the second exemplary DFF circuit 200 includes 7 transistors. The third exemplary circuit is referred to as an "Extended True-Single-Phase-Clock D-Type Flip-Flop" (E-TSPC DFF).

Figure 3:
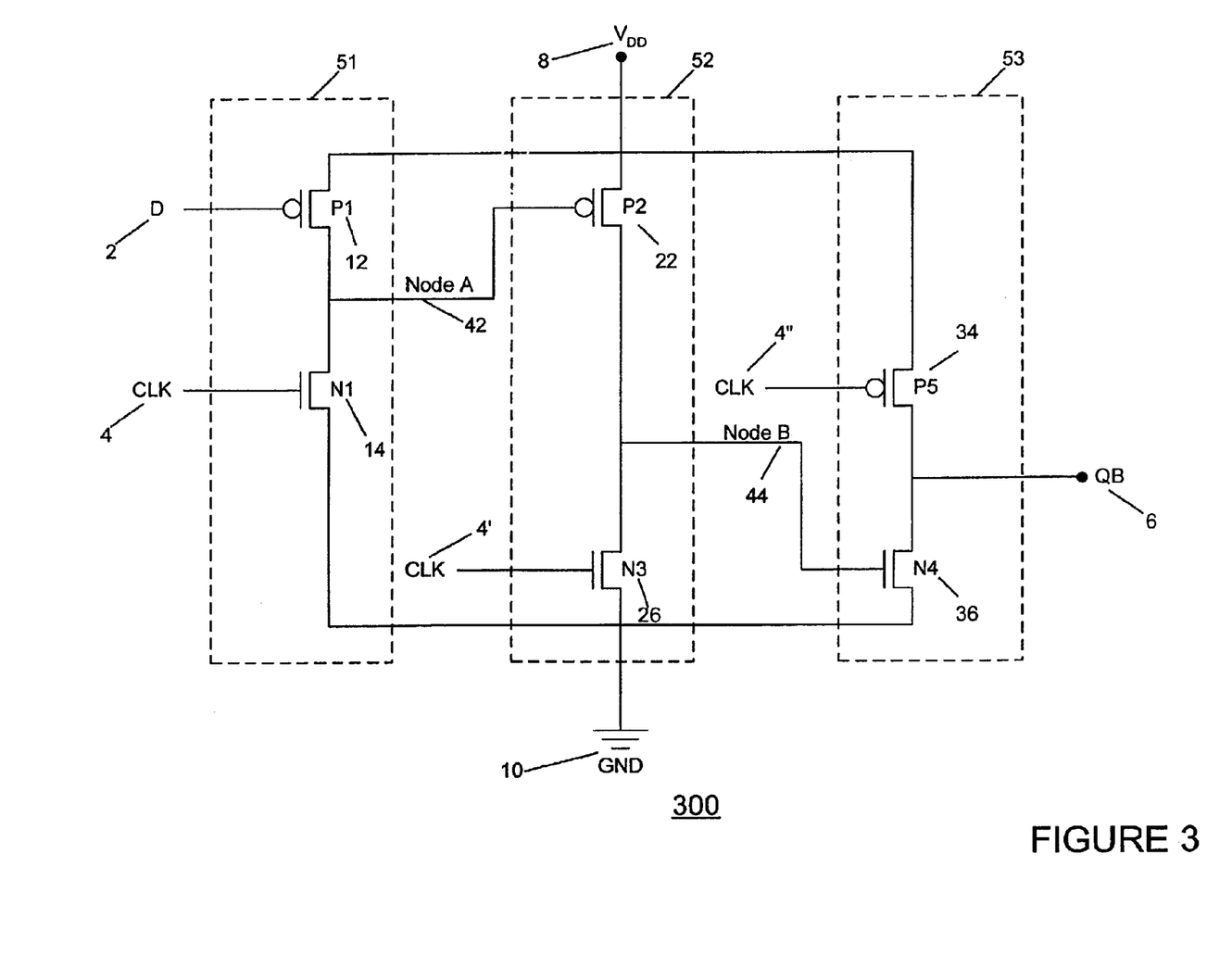
FIG. 3 is a schematic diagram of a dynamic DFF made in accordance with the present invention.

FIG. 3 is a schematic diagram of an exemplary E-TSPC DFF. As shown in FIG. 3, the exemplary E-TSPC DFF circuit 300 includes 6 transistors: N1 14, N3 26, N4 36, P1 12, P2 22 and P5 34. A clock signal (referred to hereinafter as either "CLK" or "C") 4, 4', and 4" inputs respectively to 3 transistors: N1 14, N3 26 and P5 34. The exemplary E-TSPC circuit 300 includes three transistor stages. As shown in FIG. 3, a first stage 51 includes the stacked transistors P1 12 and N1 14; a second stage 52 includes the stacked transistors P2 22 and N3 26; and a third stage 53 includes the stacked transistors P5 34 and N4 36. The third exemplary DFF circuit 300 is substantially similar to the second exemplary DFF circuit 200 (FIG. 2), and thus is not described in more detail herein. Identical components function similarly in both circuits.

One embodiment of the third exemplary DFF circuit 300 is referred to as a "Ratioed Logic Extended True-Single-Phase-Clock D-type Flip-Flop" (RL E-TSPC DFF) and is described in an article by Soares and Van Noije, entitled "A 1.6-GHz Dual Modulus Prescaler Using the Extended True-Single-Phase-Clock CMOS Circuit Technique (E-TSPC)," published in 1999 in the IEEE Journal of Solid State Circuits, 34(1), at pages 97–102 (and at FIG. 6), by IEEE. The article is hereby incorporated by reference herein for its teachings on digital circuit design. The RL E-TSPC implements ratioed logic techniques for all transistor stages (i.e., the first stage 51, the second stage 52 and the third stage 53).

Although the RL E-TSPC DFF is substantially similar in design to the second exemplary DFF circuit 200 (FIG. 2), all three transistor stages of the RL E-TSPC DFF use ratioed logic design. Specifically, the first stage 51 utilizes a ratioed logic technique which is implemented using only the transistors P1 12 and N1 14. The ratioed logic technique of the first stage requires that the transistor size ratio between the transistor P1 12 and the transistor N1 14 be selected so that the state of Node A 42 remains at a logical high level (referred to hereinafter simply as "high") regardless of the state of the input CLK 4, 4', 4", when the state at the input D 2 is at a logical low level (referred to hereinafter as "low"). Stated in other terms, the ratioed logic technique of the first stage ensures that Node A remain high when P1 is conducting, and low when P1 is not conducting. One exemplary transistor size ratio is four-to-one (P1-to-N1) or greater.

Disadvantageously, the ratioed logic technique of the first stage causes a decrease in the maximum operating speed and frequency of the RL E-TSPC DFF embodiment of the E-TSPC DFF 300. This decrease in operating speed results from the requirement that the transistor size ratio of P1 12 to N1 14 ensures that, when D is low, the node A 42 remains high regardless of the value of the input CLK. Therefore, transistor P1 12 must be much larger than the transistor N1 14 (e.g., P1 12 must be at least four times larger than N1 14). This requirement creates extremely mismatched transistor sizes because the drive strength of PMOS transistors is typically weaker than the drive strength of similarly sized NMOS transistors. Thus, the maximum operating speed and frequency of the RL E-TSPC DFF is decreased.

Another disadvantage associated with the TSPC DFF circuit 100, ND DFF circuit 200 and the RL E-TSPC circuit 300 (FIGS. 1–3, respectively) is that the operating speeds are relatively sensitive to parasitic capacitances. Specifically, and referring now to FIGS. 1–3, nodes A 42 and B 44 are very sensitive to parasitic capacitances when the TSPC DFF 100, ND DFF 200 and RL E-TSPC 300 circuits are manufactured using bulk silicon material. This sensitivity to parasite capacitances detrimentally affects circuit performance.

Therefore, a need exists for a dynamic d-type flip-flop circuit that operates at high speeds and has increased maximum operating frequencies. The dynamic DFF should be relatively simple to implement. Such a dynamic DFF circuit should be manufactured using transistors having sizes that allow the circuit to operate reliably near maximum speeds. The present invention provides such a dynamic d-type flip-flop circuit.

SUMMARY OF THE INVENTION

The present invention is a novel dynamic DFF method and apparatus for use in complex circuits. The dynamic DFF method and apparatus utilizes an inventive transistor design, and thus obviates the need for ratioed logic transistors in a first stage of the circuit. An exemplary CMOS substrate that can be utilized with the present invention is fabricated using Silicon-on-Insulator (SOI) technologies, which include, for example, separation by implanted oxygen (SIMOX), silicon-on-sapphire, bulk silicon and UTSi.

The method and apparatus of the present invention improves the operating speed of dynamic d-type flip-flop circuits. Specifically, the present invention does not require use of a ratioed logic design in a first stage of transistors, and thus PMOS and NMOS transistors in the first stage are not required to have disproportionate P-to-N transistor size ratios. Consequently, these transistors can have a transistor size ratio that provides increased operating speeds. The inventive circuit also consumes less power than the prior art designs. A number of embodiments of the present invention are described. In one embodiment, a dynamic DFF is described. Another embodiment of the present invention provides a dynamic DFF including a merged logic "AND" gate. The merged logic gate design includes the merged logic "AND" function at a negligible degradation is speed.

Several exemplary applications of the present invention are described. In a first exemplary application, the present inventive DFF is utilized in a divide-by-4/5 prescaler circuit. In a second exemplary application, the present inventive DFF is utilized in a divide-by-4/5 prescaler circuit having merged "AND" gates. In a third exemplary application, the present inventive DFF is utilized in a phase lock loop circuit.

The details of the several embodiments of the present invention are set forth in the accompanying drawings and the description provided below. Once the details of the invention are known, numerous additional innovations and changes will become obvious to those skilled in the art.

BRIEF DESCRIPTION OF THE DRAWINGS

Like reference numbers and designations in the various drawings indicate like elements.

DETAILED DESCRIPTION OF THE INVENTION

Throughout this description, the embodiments and examples shown should be considered as exemplars, rather than as limitations on the present invention.

The method and apparatus of the present invention improves the operating speed of dynamic d-type flip-flop circuits. The present invention comprises an E-TSPC DFF having three stages, wherein a first stage does not use ratioed logic transistors. The PMOS and NMOS transistors of the first stage can use a size ratio (e.g., 1-to-1 transistor size ratio) that advantageously increases the maximum operating frequency of the circuit. The present inventive DFF advantageously has reduced parasitic capacitance and reduced power consumption.

The second and third stages of the present inventive E-TSPC DFF circuit use ratioed logic transistors. Proper circuit operation requires the input/output speed of the first stage of transistors to exceed that of the second stage. The present invention achieves proper circuit operation using an inventive transistor design in the manufacture of the device. In one exemplary embodiment, the inventive dynamic DFF circuits are fabricated on silicon-on-insulator (SOI) substrates.

Silicon-on-insulator technologies are well suited for high-performance microelectronics, and in particular, in applications requiring radiation hardness ("rad-hard") and high-speed operation. SOI technologies are well known in the integrated circuit fabrication arts. Exemplary silicon-on-insulator technologies include SIMOX, bonded wafers having a thin silicon layer bonded to an insulating layer, and silicon-on-sapphire.

One especially useful SOI technology is the "ultrathin silicon-on-sapphire" or "UTSi" technology. This technology is used in the fabrication of silicon-on-sapphire substrates for use with active and passive devices. UTSi techniques are disclosed in the following publications: U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). These issued patents are hereby incorporated by reference herein for their teachings on SOI technology and design.

Several embodiments of the present invention are now described. In one embodiment, a dynamic DFF is disclosed. In another embodiment, transistors are configured into a dynamic DFF including a merged logic "AND" gate. The merged configuration of this embodiment advantageously increases processing speeds as compared with similar circuit designs implemented using separate components.

The present inventive dynamic DFF is a fundamental circuit block that can be used as a building block to produce more complex circuit designs such as prescalers, phase lock loops (PLL), storage registers, and shift registers. Exemplary prescaler and PLL circuits utilizing the present invention are described herein. Those skilled in the circuit design arts shall appreciate that the method and apparatus of the present invention can be used in any circuit that requires use of DFFs.

Dynamic D-type Flip-Flop Circuit of the Present Invention

The D-type flip-flip circuit of the present invention includes a first stage of stacked transistors of an E-TSPC DFF that does not require ratioed logic because the first stage has a faster input/output speed than a second stage of stacked transistors. In general, for double-stacked P/N transistors, as is well known, performance improves when the P-to-N transistor size ratio (PNSR) approaches the average of the ratio of the P-to-N drive strength.

A preferred P-to-N transistor size ratio can be determined empirically (e.g., via circuit simulations). An exemplary empirical method for determining a preferred PNSR determines an initial PNSR according to the following Equation 1 and then performs circuit simulations to determine the preferred PNSR (i.e., the PNSR that yields the fastest circuit speeds).

$$PNSR = \sqrt{D}; \text{ where } D \text{ is the } N\text{-to-}P \text{ relative drive strength} \quad \text{(Equation 1)}$$

For example, the initial PNSR for a circuit is 1.414 when the N-to-P relative drive strength (D) is 2. Two embodiments of the present inventive dynamic DFF are now described. A first embodiment of the present invention is now described with reference to FIG. 3.

The first embodiment of the present inventive DFF is referred to as the "non-ratioed logic E-TSPC DFF" ("NRL E-TSPC DFF"). The inventive E-TSPC DFF circuit 300 is shown in FIG. 3. The circuit structure of the E-TSPC DFF of FIG. 3 was described above with regard to the third exemplary RL E-TSPC DFF circuit, and thus is not described in more detail here. As shown in FIG. 3, the first stage 51 of the inventive circuit 300 includes two inputs (D2 and CLK4) and one output node (Node A42). The second stage 52 of the inventive circuit 300 includes two inputs (Node A 42 and CLK4') and one output node (Node B44). The third stage 53 includes two inputs (Node B44 and CLK4") and one output node (QB6). The NRL E-TSPC DFF circuit of the present invention is manufactured using CMOS (e.g., SOI, UTSi, SIMOX, silicon-on-sapphire and bulk silicon).

The NRL E-TSPC DFF circuit of the present invention operates on a negative-edge or falling-edge triggered basis (i.e., output node QB6 changes logical states subsequent to a falling edge of CLK4, 4', 4"). The negative edge (or falling edge) of a signal occurs when the signal transitions from a logical high state to a low state. As those skilled in the art shall recognize, negative-edge triggering is an exemplary triggering technique. Other triggering techniques, such as positive-edge triggering, can be used with the present invention without departing from its scope or spirit.

Referring again to FIG. 3, several operating environments are now described. In a first operating environment, the CLK4, 4', 4" and D2 inputs of the NRL E-TSPC DFF circuit are initially high. Thus, the states of the circuit elements are as follows: Node A42 and Node B44 are low; N1 14, N3 26 and P2 22 are on; and P1 12, P5 34 and N4 36 are off. Output QB6 retains the state of its previous output because PS and N4 are both off. When the input CLK4, 4', 4" transitions from a high to a low state, the states of P1 12, N1 14 and N3 26 are off, while P2 22, P5 34 and N4 36 are on, which results in the following actions: Node A42 remains low because both P1 12 and N1 14 are off and the previous state for Node A42 is low; Node B44 transitions from low to high because P2 22 is on while N3 26 is off; and output QB6 is low because P5 34 and N4 36 are both on and N4 36 has a stronger drive strength than the drive strength of P5 34. In summary, when D2 is high and a falling edge of CLK4, 4', 4" occurs, output node QB6 is subsequently low, and thus, the circuit operates properly (i.e., in accordance with the I/O characteristics of typical DFFs). Proper circuit operation requires that the output node QB6 remain in the same state regardless of changes occurring in the state of D2 prior to the next clock trigger (i.e., prior to the next falling edge of CLK4, 4', 4"). Subsequent to the first operation scenario, proper circuit operation requires that output node QB6 remains low (i.e., unchanged) prior to the next clock trigger. To verify this requirement in the NRL E-TSPC DFF, the following circuit states are described. Subsequent to the first operation scenario, QB6 is low; D2 is high; and CLK4, 4', 4" is low. If D2 transitions from high to low, Node A42 transitions from low to high. Thus, the states of the circuit elements are as follows: Node A42 is high; Node B44 retains its previous state of high; N1 14, N3 26 and P2 22 are off; and P1 12, P5 34 and N4 36 are on. Therefore, QB6 remains unchanged at low.

In a second circuit operation scenario of the NRL E-TSPC DFF, initially, the CLK inputs 4, 4', 4" are high and D2 is low. Thus, the states of the internal circuit elements are as follows: Node A42 and Node B44 are low; P1 12, N1 14, N3 26 and P2 22 are on; P5 34 and N4 36 are off; and output node QB retains its previous state. When the input clock CLK4, 4', 4" transitions from high to low, the states of the transistors P1 12 and P5 34 are on, while the transistors P2 22, N1 14, N3 26 and N4 36 are off. This results in the following actions activities: Node A42 transitions from low to high and Node B44 remains low because both P2 22 and N3 26 are off and the previous state of Node A42 is low. Output node QB6 is high because the transistor P5 34 is on and the transistor N4 36 is off. In summary, when the input D2 is low and a falling edge of CLK4, 4', 4" occurs, the output QB6 subsequently is high, and thus, the circuit operates properly (i.e., in accordance with the I/O characteristics of typical DFFs).

Subsequent to the second circuit operation scenario described above, for proper circuit operation, the output QB6 must remain high (i.e., unchanged) prior to the next triggering event. Subsequent to the second operation scenario, the output QB6 is high input, D2 is low, and input CLK4, 4', 4" is low. If the input D2 transitions from low to high, the Node A42 and Node B44 remain unchanged, and thus the output QB6 remains unchanged at a high state.

The DFF of FIG. 3 is designed with non-ratioed transistor logic in the first stage 51. A potential minor problem or "glitch" may occur during the operation of the DFF circuit. Under certain conditions, the Node B44 increases voltage levels toward a logical "high" state. This has the potential of improperly turning the transistor N4 36 on and causing improper circuit operation. The circuit state conditions and possible effects are provided in TABLE 1 below:

TABLE 1

| ACTION | DESCRIPTION OF CIRCUIT OPERATION |
| --- | --- |
| Initial State of Circuit Inputs | Input D 2 at low; and CLK 4, 4', 4" at high. |
| Effect of Initial State | Node A 42 and Node B 44 are both low; and P1 12 and P2 22 are both on. |
| Clock Transition | CLK 4, 4', 4" transitions from high to low. |
| Effect of Clock Transition | N1 14 and N3 26 both turn off. |
| Effect of N1 14 and N3 26 Turning Off | Node A 42 begins to transition from low to high; and Node B 44 begins to transition from low to high. |
| POTENTIAL "GLITCH" | - Two possible outcomes can occur at this point: 1) Proper Operation and 2) Improper Operation. |
| 1) Proper Operation | Node A 42 transitions to high before Node B 44 transitions to high, and thus P2 22 turns off. This prevents Node B 44 from transitioning to high (i.e., stops the voltage rise at Node B 44), and thus prevents N4 36 from turning on, which would cause improper output at QB 6. |
| 2) Improper Operation | Node B 44 transitions to high before Node A 42 transitions to high, and thus N4 36 turns on, which causes improper output at QB 6. In this outcome, Node B 44 transitioned to high before Node A 42 turned off P2 22. |

Proper circuit operation can be maintained by designing the circuit such that the I/O speed of the first stage 51 is faster than the I/O speed of the second stage 52. In an exemplary embodiment of the DFF 300 of the present invention, the I/O speed of the first stage is increased by reducing parasitic capacitances on the Node A42. In one approach, parasitic capacitances are reduced by carefully laying out the elements of the circuit 300 during design. A second embodiment of the present invention is now described with reference to FIG. 4.

Figure 4:
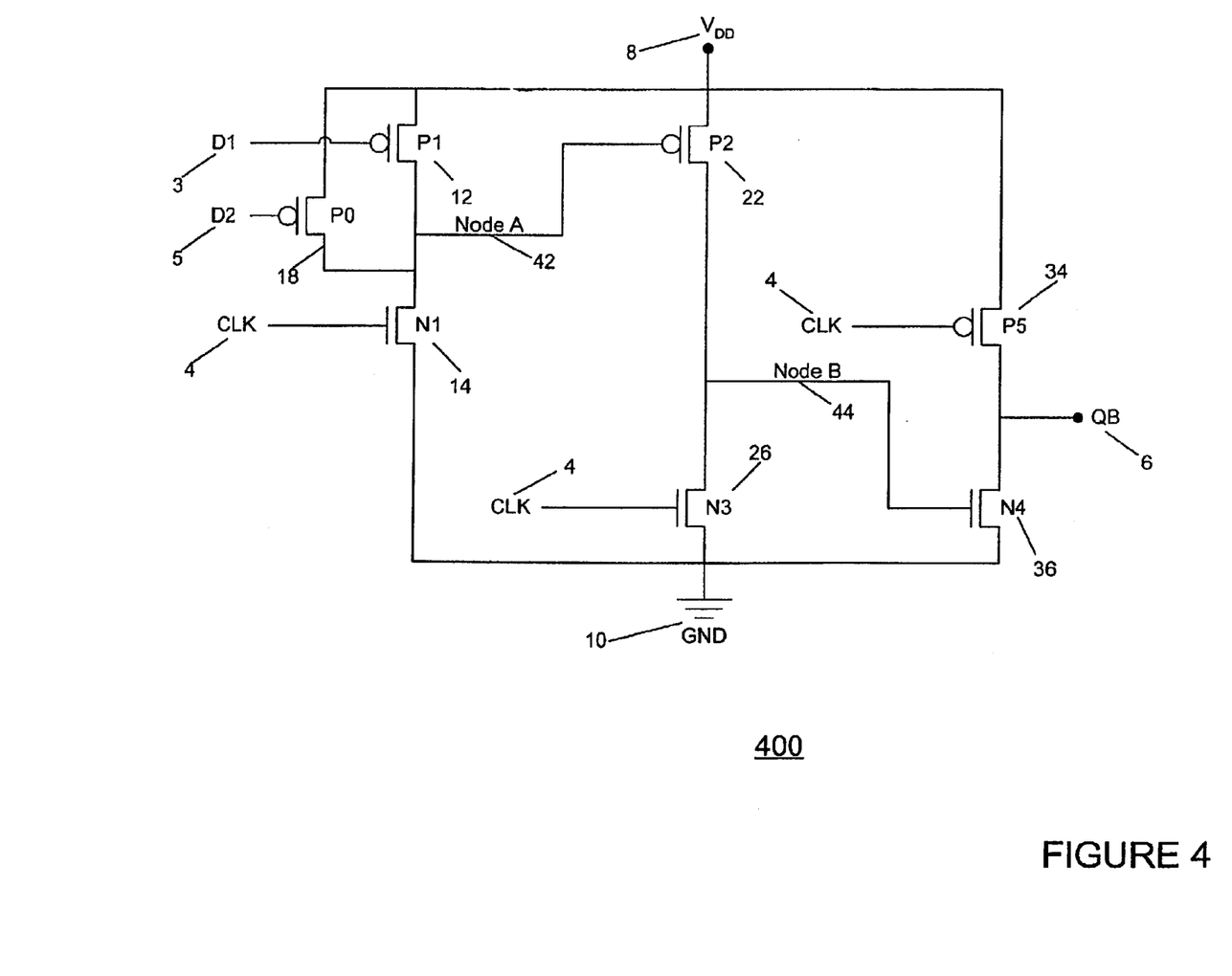
FIG. 4 is a schematic diagram of another embodiment of a dynamic DFF made in accordance with the present invention.

The second embodiment of the present inventive DFF is referred to as a "non-ratioed logic E-TSPC DFF with merged AND gate" (NRL E-TSPC DFF with merged AND gate). The second embodiment of the present invention functions in a substantially similar manner to the first embodiment described above with reference to FIG. 3. The second embodiment implements a logical "AND gate" function at the input of the DFF. This advantageously provides an additional logic function with only a very small reduction in circuit speed.

FIG. 4 is a simplified schematic diagram of the second embodiment of the present inventive DFF. The inventive second embodiment is substantially similar to the NRL E-TSPC DFF of FIG. 3, and thus identical components and circuit operatives are not described. As shown in FIG. 4, the second embodiment 400 includes three inputs (D1 3, D2 5 and CLK4) and one output (QB6). The inputs D1 3 and D2 5 are operatively coupled to the transistors P1 12 and P0 18, respectively. D1 3, D2 5, P1 12 and P0 18 operate together to function as a merged "AND" gate. The simple merged AND gate circuit design of the second embodiment is faster than using a DFF connected to a separate logic AND gate.

Figure 5A:
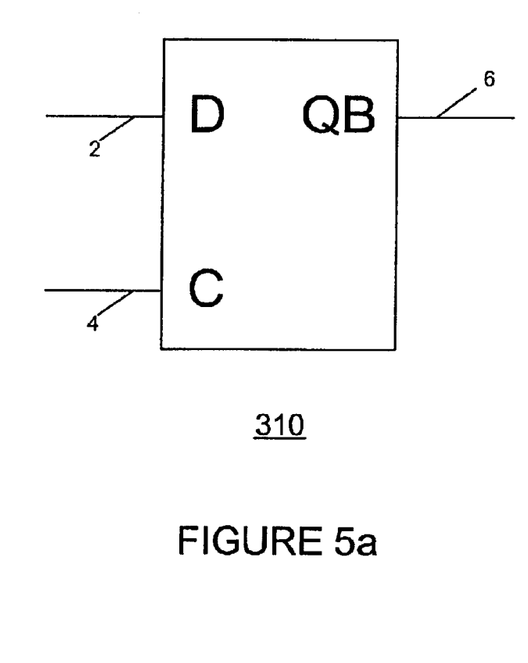
FIG. 5a is a simplified logic block of the inventive DFF of FIG. 3.
Figure 5B:
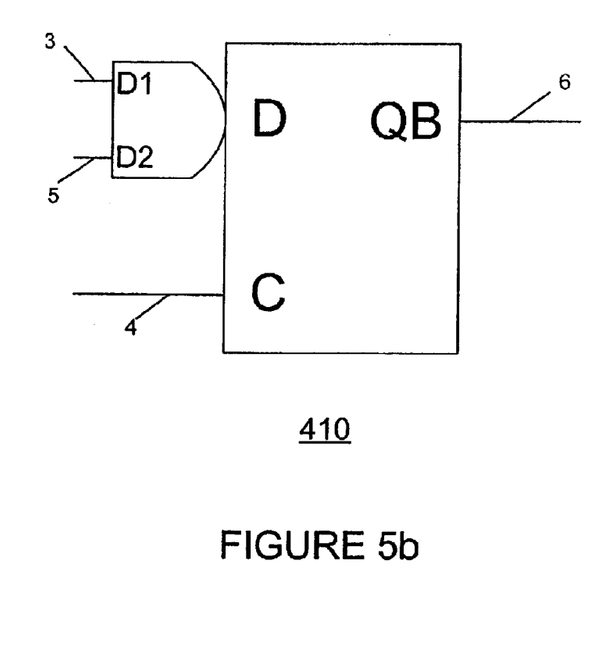
FIG. 5b is a simplified logic block of the inventive DFF of FIG. 4.

FIGS. 5a and 5b show simplified logic block representations of the inventive circuits 300 and 400, respectively, described above with reference to FIGS. 3 and 4. FIG. 5a represents the first embodiment of the present inventive dynamic DFF. As shown in FIG. 5a, the NRL E-TSPC DFF includes two inputs (D2 and C4) and an output (QB6). FIG. 5b represents the second embodiment of the present inventive dynamic DFF. As shown in FIG. 5b, this embodiment includes three inputs (D1 3, D2 5 and C4) and an output (QB6).

Those skilled in the digital design arts shall recognize that the present invention is not to be limited to the first and second embodiments described above with reference to FIGS. 3 and 4. Alternative configurations and circuit elements can be used to implement the present invention without departing from its scope or spirit. For example, the present invention may be implemented as an NRL E-TSPC DFF with merged OR gates, merged NOR gates and merged NAND gates.

Exemplary Applications of the Present Inventive Dynamic D-type Flip-Flop Circuit The present inventive dynamic DFF can be used as a basic circuit element Using the present inventive DFF circuit element, complex circuits such as prescalers, phase lock loops (PLL), storage registers and shift registers can be implemented. Those of ordinary skill in the electronics design arts shall recognize that the method and apparatus of the present invention can be used to build virtually any circuit that uses DFFs.

To facilitate a better understanding of the inventive dynamic DFF circuits and their use in more complex circuit designs, three exemplary circuits are described: a divide-by-4/5 prescaler circuit, an optimized divide-by-4/5 prescaler circuit with merged AND gates, and a phase lock loop including a divide-by-2 prescaler circuit. All three exemplary circuits are designed using the inventive DFF as a basic circuit element. The first exemplary circuit application is now described with reference to FIG. 6.

Figure 6:
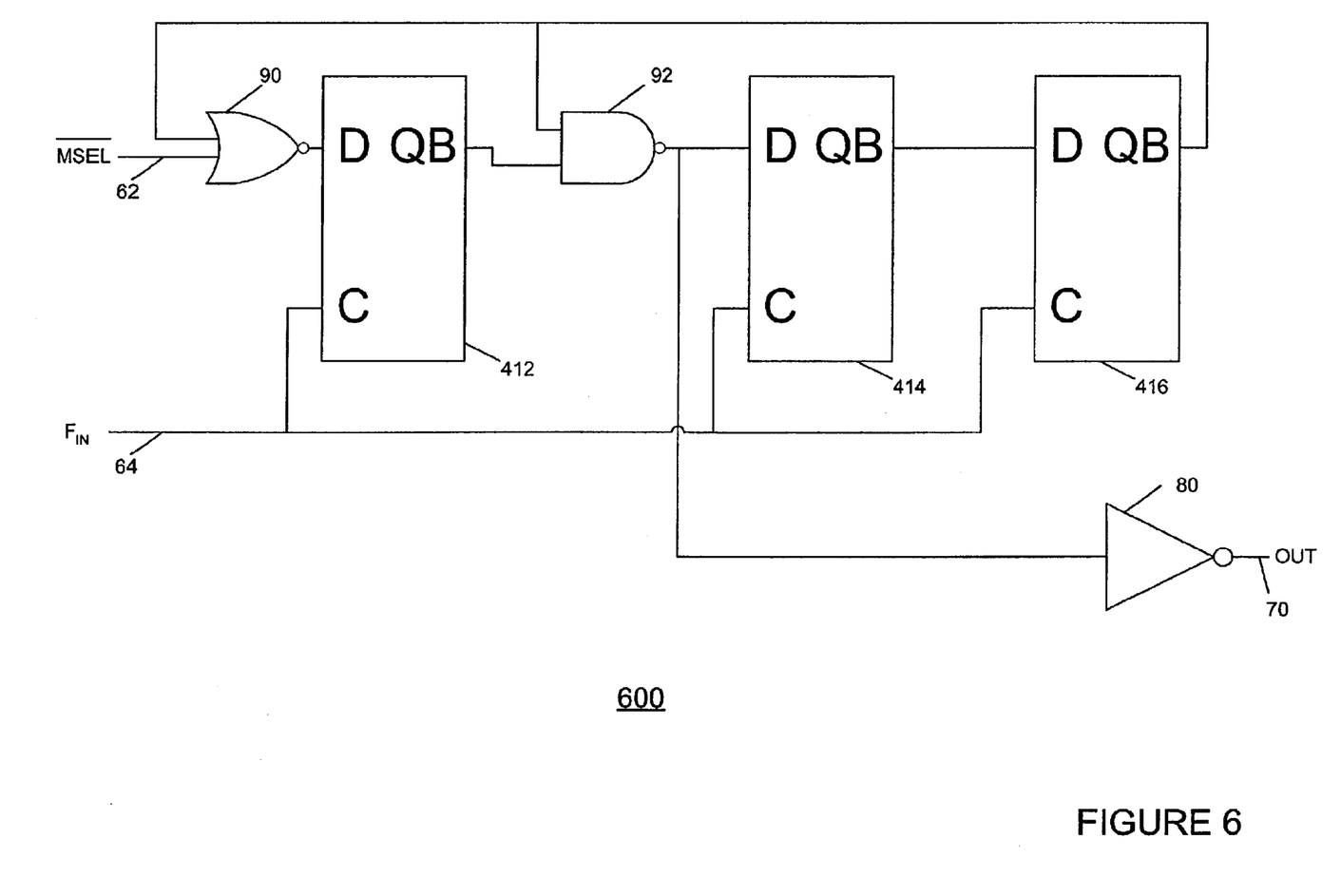
FIG. 6 is a block diagram of a first exemplary circuit application using the present inventive dynamic DFF.

The first exemplary circuit application is a "divide-by-4/5" prescaler circuit as shown in FIG. 6. Divide-by-4/5 prescaler circuits function to either divide an input by 4, or 5, depending on its operating mode. As shown in FIG. 6, the first exemplary circuit application 600 includes a Mode Select input (MSEL 62), a Frequency IN input (FIN 64), three inventive DFFs 412, 414, 416, a logical NOR gate 90, a logical NAND gate 92 and an output (OUT) 70. Divide-by-4/5 prescaler circuits are well known and thus a detailed description of the operation of the first exemplary circuit application 600 is not described herein. The first exemplary circuit application 600 operates in a "divide-by-4" mode when the MSEL 62 is high and in a "divide-by-5" mode when the MSEL 62 is low. In the divide-by-4 mode, the frequency output at the OUT 70 is ¼ of the $F_{IN}$ 64. In the divide-by-5 mode, the frequency output at the OUT 70 is ⅕ of the $F_{IN}$ 64.

The second exemplary application for the present inventive DFF comprises a divide-by-4/5 prescaler circuit having merged logic "AND" gates. The second exemplary application improves upon the first exemplary implementation because it has improved I/O speed. Specifically, use of the merged AND gates reduces propagation delay, and thereby increases the I/O speed of the circuit.

Figure 7:
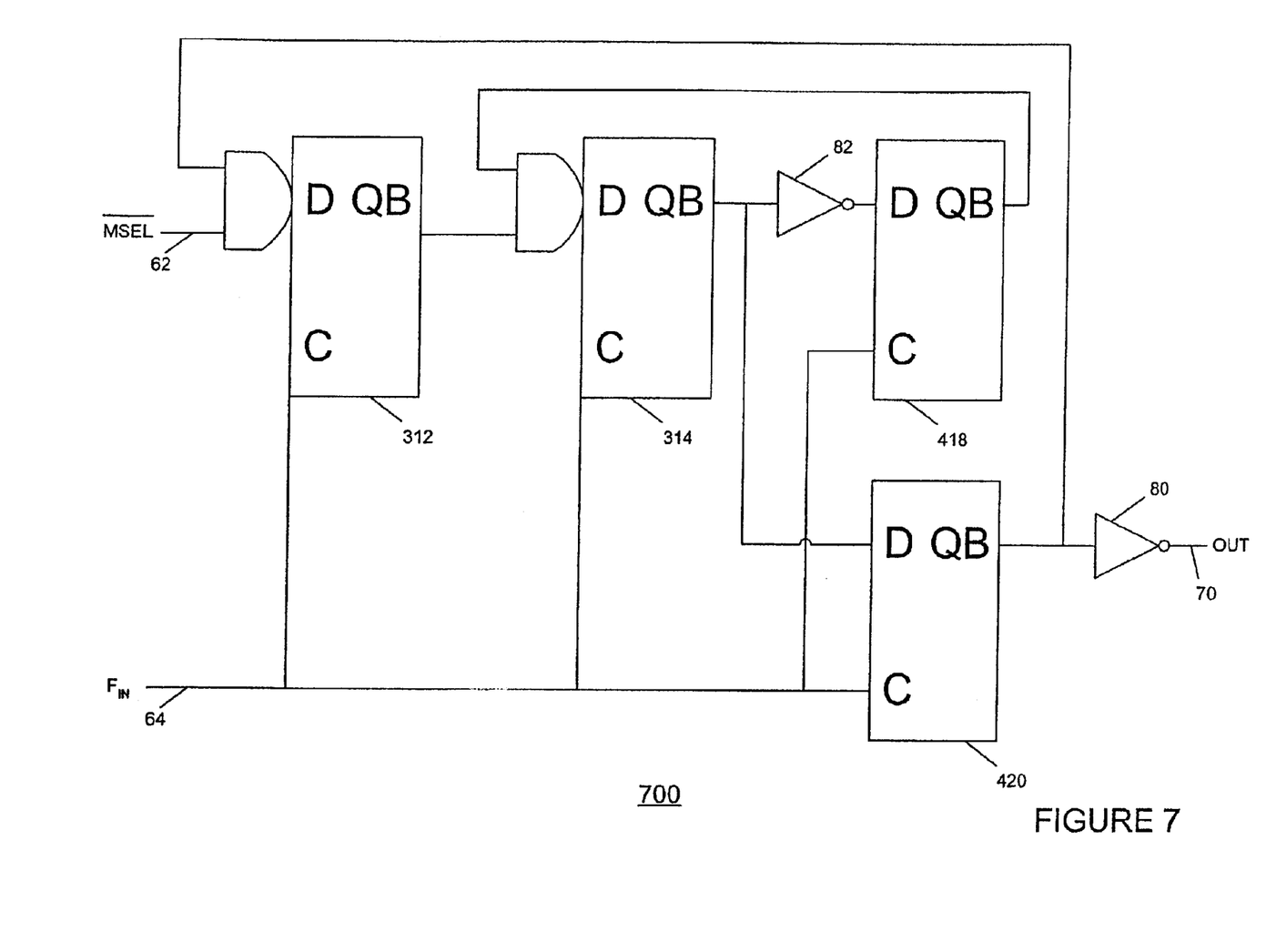
FIG. 7 is a block diagram of a second exemplary circuit application using the inventive dynamic DFF.

FIG. 7 shows a simplified block diagram of the second exemplary application of the dynamic DFF of the present invention. As shown in FIG. 7, the second exemplary implementation 700 includes a Mode Select (MSEL input 62), a Frequency IN ($F_{IN}$ input 64), three DFFs 312, 314, 418, and 420, inverters 80, 82 and an output (OUT). The second exemplary circuit application 700 operates in a "divide-by-4" mode when the MSEL 62 is high and in a "divide-by-5" mode when the MSEL 62 is low. In the divide-by-4 mode, the frequency output at the OUT 70 is ¼ of the $F_{IN}$ 64. In the divide-by-5 mode, the frequency output at the OUT 70 is ⅕ of the $F_{IN}$ 64. The second exemplary implementation 700 features merged AND gates, which reduce logic functions between adjacent DFFs.

Figure 8:
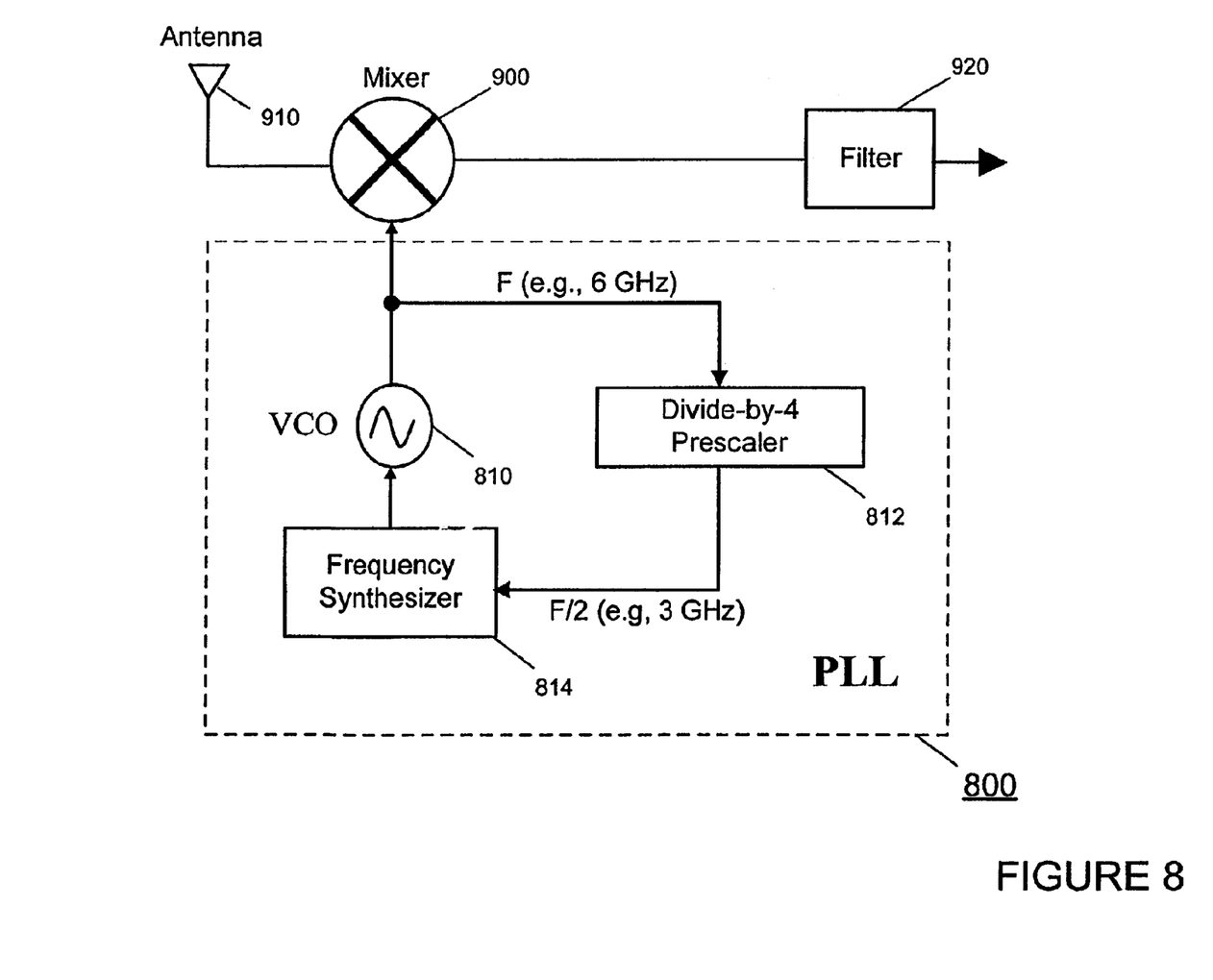
FIG. 8 is a block diagram of a third exemplary circuit application using the present inventive dynamic DFF.

The third exemplary application of the inventive dynamic DFF is a phase lock loop including a divide-by-2 prescaler circuit FIG. 8 shows a simplified block diagram of the third application circuit using the DFF of the present invention. As shown in FIG. 8, the phase lock loop (PLL) 800 includes a voltage-controlled oscillator (VCO) 810, a divide-by-2 prescaler circuit 812, and a frequency synthesizer 814. The VCO 810 generates an oscillator signal having a frequency F that inputs to both a mixer 900 and a divide-by-2 prescaler circuit 812. The divide-by-2 prescaler circuit 812 divides the frequency F by 2, and outputs a divided-down signal having a frequency equal to F/2. The divided-down signal is input to the frequency synthesizer 814. The frequency synthesizer 814 provides control information to the VCO 810 based upon the divided-down signal.

The PLL 800 inputs the oscillator signal to a mixer 900. The mixer 900 receives a rf signal from an antenna 910 and modulates the rf signal and the oscillator signal to produce a modulated signal. The mixer 900 inputs the modulated signal to a filter 920. The filter 920 outputs the filtered signal for further processing.

Figure 9:
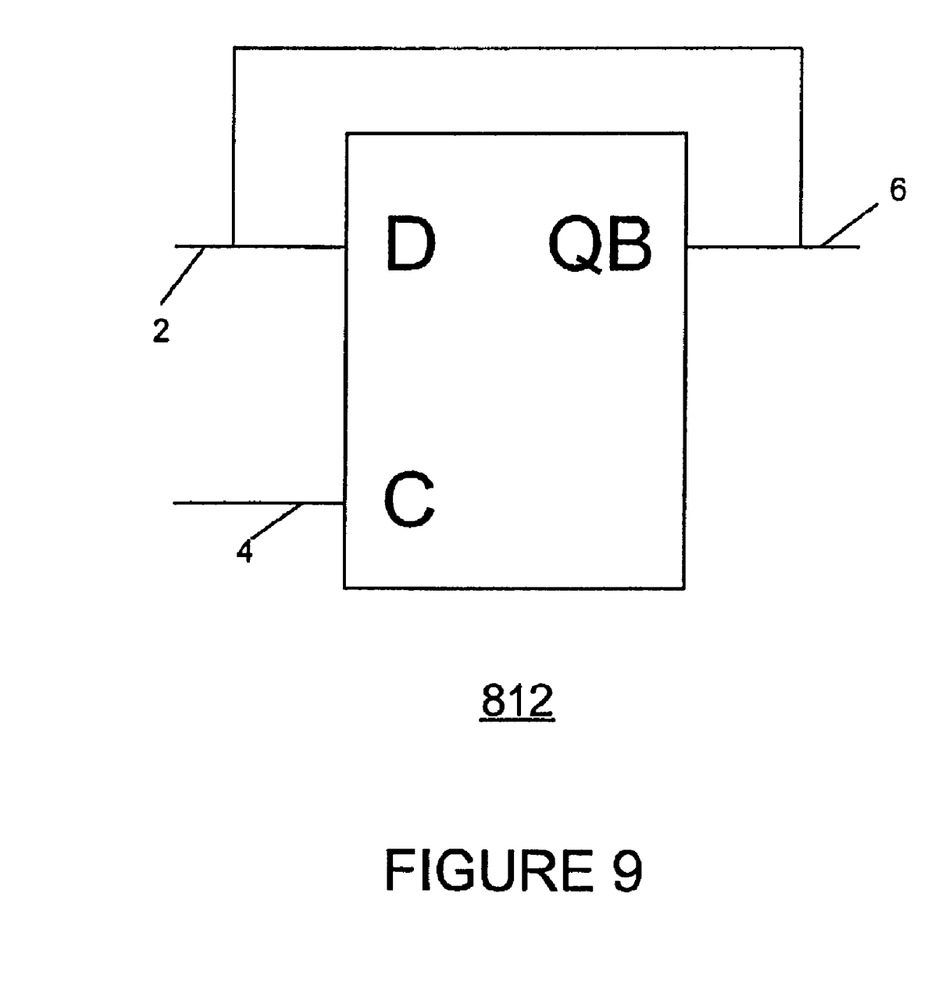
FIG. 9 shows a logic block representation of the divide-by-2 prescaler circuit of FIG. 8.

FIG. 9 shows a logic block representation of the divide-by-2 prescaler circuit of FIG. 8. FIG. 9 represents an embodiment of the present inventive dynamic DFF of FIGS. 3 and 5a. As shown in FIG. 9, the divide-by-2 prescaler circuit 812 includes two inputs (D2 and C4) and an output (QB6). The divide-by-2 prescaler circuit 812 is identical to the first embodiment DFF described above with reference to FIG. 5a with an additional connection between the output QB6 and the input D2.

In summary, the dynamic DFF method and apparatus of the present invention overcomes the requirement for use of ratioed logic in a first stage of the DFF circuit design because the first stage has a faster input/output speed than a second stage of the DFF circuit. An exemplary CMOS substrate that can be used with the present invention may be fabricated using SOI technologies, which include, for example, SIMOX, silicon-on-sapphire, and UTSi. Two embodiments of the present inventive dynamic DFF have been described.

The method and apparatus of the present invention improves the operating speeds of dynamic d-type flip-flop circuits. Specifically, because the present inventive DFF does not use a ratioed logic in a first stage of transistors, the PMOS and NMOS transistors of the first stage are not constrained to have severely disproportionate P-to-N transistor size ratios. Therefore, these transistors can use a transistor size ratio that increases the circuit's operating speed. In addition, the present inventive DFF advantageously has low parasitic capacitances and reduced power requirements.

A number of embodiments of the present invention have been described. Nevertheless, it will be understood that various modifications may be made without departing from the spirit and scope of the invention. For example, in one embodiment, a dynamic DFF is disclosed. In another embodiment a dynamic DFF, including a merged logical "AND" gate is disclosed.

Accordingly, it is to be understood that the invention is not to be limited by the specific illustrated embodiment, but only by the scope of the appended claims.

What is claimed is:

1. A d-type flip-flip (DFF) circuit, comprising:

a) a first transistor stage, having a first P transistor, a first N transistor, a first signal input, a first clock input and a first signal output, wherein the first signal input is coupled to the first P transistor, and wherein the first clock input is coupled to the first N transistor, and wherein the first P transistor and the first N transistor are serially coupled, and wherein the first transistor stage has a first I/O speed;

b) a second transistor stage, operatively coupled to the first transistor stage, having a second P transistor, a second N transistor, a second signal input, a second clock input and a second signal output, wherein the first signal output is coupled to the second signal input, and wherein the second signal input is coupled to the second P transistor, and wherein the second clock input is coupled to the second N transistor, and wherein the second P transistor and the second N transistor are serially coupled, and wherein the second transistor stage has a second I/O speed that is slower than the first I/O speed; and c) a third transistor stage, operatively coupled to the second transistor stage, having a third P transistor, a third N transistor, a third signal input, a third clock input and a third signal output, wherein the second signal output is coupled to the third signal input, and wherein the third signal input is coupled to the third N transistor, and wherein the third clock input is coupled to the third P transistor, and wherein the third P transistor and the third N transistor are serially coupled.

2. The DFF circuit as defined in claim 1, further comprising a clock, coupled to the first, second and third clock inputs, wherein the clock outputs a clock signal.

3. The DFF circuit as defined in claim 1, wherein the second transistor stage and the third transistor stage utilize ratioed logic techniques.

4. The DFF circuit as defined in claim 1, wherein the first signal input is connected to a gate of the first P transistor.

5. The DFF circuit as defined in claim 1, wherein the second signal input is connected to a gate of the second P transistor.

6. The DFF circuit as defined in claim 1, wherein the third signal input is connected to a gate of the third N transistor.

7. The DFF circuit as defined in claim 1, wherein the first signal output is connected to a drain of the first P transistor.

8. The DFF circuit as defined in claim 1, wherein the second signal output is connected to a drain of the second P transistor.

9. The DFF circuit as defined in claim 1, wherein the DFF circuit operates on a negative-edge triggered basis.

10. The DFF circuit as defined in claim 1, wherein the first stage has an initial P-to-N transistor size ratio (PNSR) in accordance with the following equation:

$PNSR = \sqrt{D}$; where $D$ is a $N$-to-$P$ relative drive strength.

11. The DFF circuit as defined in claim 1, wherein the DFF circuit is fabricated using a silicon-on-insulator technology.

12. The DFF circuit as defined in claim 11, wherein the silicon-on-insulator technology is SIMOX.

13. The DFF circuit as defined in claim 11, wherein the silicon-on-insulator technology is bonded wafers having a thin silicon layer bonded to an insulating layer.

14. The DFF circuit as defined in claim 11, wherein the silicon-on-insulator technology is silicon-on-sapphire.

15. The DFF circuit as defined in claim 11, wherein the silicon-on-insulator technology is ultra-thin silicon-on-sapphire.

16. The DFF circuit as defined in claim 11, wherein the silicon-on-insulator technology is bulk silicon.

17. The DFF circuit as defined in claim 1, wherein the first transistor stage further comprises a fourth P transistor and a fourth signal input, wherein the fourth P transistor is connected in parallel to the first P transistor, and wherein the fourth signal input is coupled to a gate of the fourth P transistor.

18. The DFF circuit as defined in claim 17, wherein the first P transistor, fourth P transistor, first signal input and fourth signal input emulate a logical AND gate.

19. The DFF circuit as defined in claim 1, wherein the third signal output is operatively connected to the first signal input, and wherein the DFF circuit outputs a divide-by-2 signal.

20. A divide-by-4/5 prescaler circuit, comprising:

a) a frequency input;

b) a set of three DFF circuits as defined in claim 1, operatively coupled to the frequency input, the set comprising a first DFF, a second DFF and a third DFF;

c) a mode select input, operatively coupled to the first DFF, having a logical high state and a logical low state; and d) an output, operatively coupled to the set of three DFF circuits;

wherein the divide-by-4/5 prescaler circuit operates in a divide-by-4 mode when the mode select input is in the logical high state and in a divide-by-5 mode when the mode select input is in the logical low state.

21. A divide-by-4/5 prescaler circuit, comprising:

a) a frequency input;

b) a set of four DFF circuits, operatively coupled to the frequency input, comprising first, second, third, and fourth DFFs as defined in claim 1, wherein the first transistor stages of the third and fourth DFFs further comprise a fourth P transistor connected in parallel to the first P transistor, and a fourth signal input coupled to a gate of the fourth P transistor.

22. A PLL circuit, comprising:

a) a VCO;

b) the DFF circuit as defined in claim 19, operatively connected to the VCO, wherein the VCO inputs a VCO signal having a frequency of F, and wherein the divide-by-2 signal has a frequency of F/2; and c) a frequency synthesizer, operatively connected to the DFF circuit and the VCO, wherein the frequency synthesizer inputs the divide-by-2 signal and outputs a control signal to the VCO.

23. The PLL circuit as defined in claim 22, further comprising:

d) an antenna, wherein the antenna receives an rf signal; and e) a mixer, operatively connected to the antenna and the VCO, wherein the mixer inputs and modulates the rf signal, and wherein the mixer outputs a modulated signal.

24. The PLL circuit as defined in claim 23, further comprising a filter, operatively connected to the mixer, wherein the filter receives the modulated signal and outputs a filtered signal.

25. The divided-by-4/5 prescaler circuit of claim 21, further comprising:
   c) a mode select input, operatively coupled to the first DFF circuit, having a logical high state and a logical low state; and
   d) an output, operatively coupled to the set of four DFF circuits and the frequency input.

26. The divider-by-4/5 prescaler circuit of claim 25, wherein the divide-by-4/5 prescaler circuit operates in a divided-by-4 mode when the mode select input is in the logical high state and in a divided-by-5 mode when the mode select input is in the logical low state.

27. An apparatus for implementing a d-type flip-flip (DFF) circuit, comprising:
   a) means for inputting a first clock signal and a first data signal;
   b) means, coupled to the first clock signal inputting means, for generating a first signal output;
   c) means, coupled to the first signal output generating means, for inputting the first signal output and a second clock signal;
   d) means, coupled to the first signal output inputting means, for generating a second signal output;
   e) means, coupled to the second signal output generating means, for inputting the second signal output and a third clock signal; and
   f) means, coupled to the second signal output inputting means, for generating a third signal output;
wherein the first signal output generating means is faster than the second signal output generating means.

28. The apparatus as defined in claim 27, wherein the first clock signal inputting means further comprises a means for inputting a second data signal.

29. The apparatus as defined in claim 28, wherein the first clock signal inputting means further comprises a means for performing a logical AND of the first data signal and the second data signal.

30. A method of implementing a d-type flip-flip (DFF) circuit, comprising:
   a) inputting a first clock signal and a first signal input to a first transistor stage;
   b) generating, in the first transistor stage, a first signal output;
   c) inputting the first signal output and a second clock signal to a second transistor stage;
   d) generating, in the second transistor stage, a second signal output;
   e) transmitting the second signal output and a third clock signal to a third transistor stage; and
   f) generating, in the third transistor stage, a third signal output;
wherein the first signal output generating act (b) is faster than the second signal output generating act (d).

31. The method as defined in claim 30, wherein the inputting act (a) further comprises inputting a second signal input to the first transistor stage.

32. The method as defined in claim 31, wherein the inputting act (a) further comprises performing a logical AND of the first data signal and the second data signal.

* * * * *